United States Patent
Fischer et al.

(10) Patent No.: US 8,258,787 B2
(45) Date of Patent: Sep. 4, 2012

(54) MAGNETIC RESONANCE SYSTEM WITH TRANSMISSION OF A DIGITIZED MAGNETIC RESONANCE SIGNAL ACROSS AN AIR GAP

(75) Inventors: Hubertus Fischer, Hamburg (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 425 days.

(21) Appl. No.: 12/563,331

(22) Filed: Sep. 21, 2009

(65) Prior Publication Data
US 2010/0072997 A1    Mar. 25, 2010

(30) Foreign Application Priority Data
Sep. 22, 2008  (DE) .................... 10 2008 048 290

(51) Int. Cl.
*G01V 3/00* (2006.01)
(52) U.S. Cl. ....................... 324/318; 324/322
(58) Field of Classification Search .................. 324/318, 324/322, 300
See application file for complete search history.

(56) References Cited

U.S. PATENT DOCUMENTS

| | | | |
|---|---|---|---|
| 6,198,287 B1 | 3/2001 | Heiserholt et al. | |
| 6,791,322 B2 | 9/2004 | Vester | |
| 7,197,357 B2 * | 3/2007 | Istvan et al. | 600/509 |
| 7,486,077 B2 | 2/2009 | Hergt et al. | |
| 7,619,415 B2 * | 11/2009 | Nakabayashi | 324/318 |
| 7,701,220 B2 * | 4/2010 | Ehnholm | 324/322 |
| 7,746,072 B2 * | 6/2010 | Van Helvoort et al. | 324/318 |
| 8,055,196 B2 * | 11/2011 | Biber et al. | 455/41.2 |
| 2008/0141461 A1 | 6/2008 | Feld et al. | |

OTHER PUBLICATIONS

"A realization of digital wireless transmission for MRI signals based on 802.11b," Wei, et al., Journal of Magnetic Resonance, vol. 186 (2007) pp. 358-363.

* cited by examiner

*Primary Examiner* — Louis Arana
(74) *Attorney, Agent, or Firm* — Schiff Hardin LLP

(57) ABSTRACT

A magnetic resonance system has a patient receptacle and a base body. The patient receptacle has a subframe and a patient bed supported thereon so as to move a patient thereon through the base body. The base body has a basic field magnet system, a gradient system and an RF system that are operable to obtain an analog magnetic resonance signal from the patient. The patient receptacle has a signal conversion device composed of an A/D converter, a modulator, and a transmitter. The base body has a signal conversion device composed of a receiver and a demodulator. The A/D converter receives the magnetic resonance signal and digitizes it. The modulator modulates a carrier signal with the digitized magnetic resonance signal. The transmitter transmits the modulated carrier signal via an air gap to the receive. The receiver receives the transmitted carrier signal. The demodulator extracts the digitized magnetic resonance signal from the received carrier signal by demodulation and supplies it to an evaluation device for continuing evaluation.

15 Claims, 2 Drawing Sheets

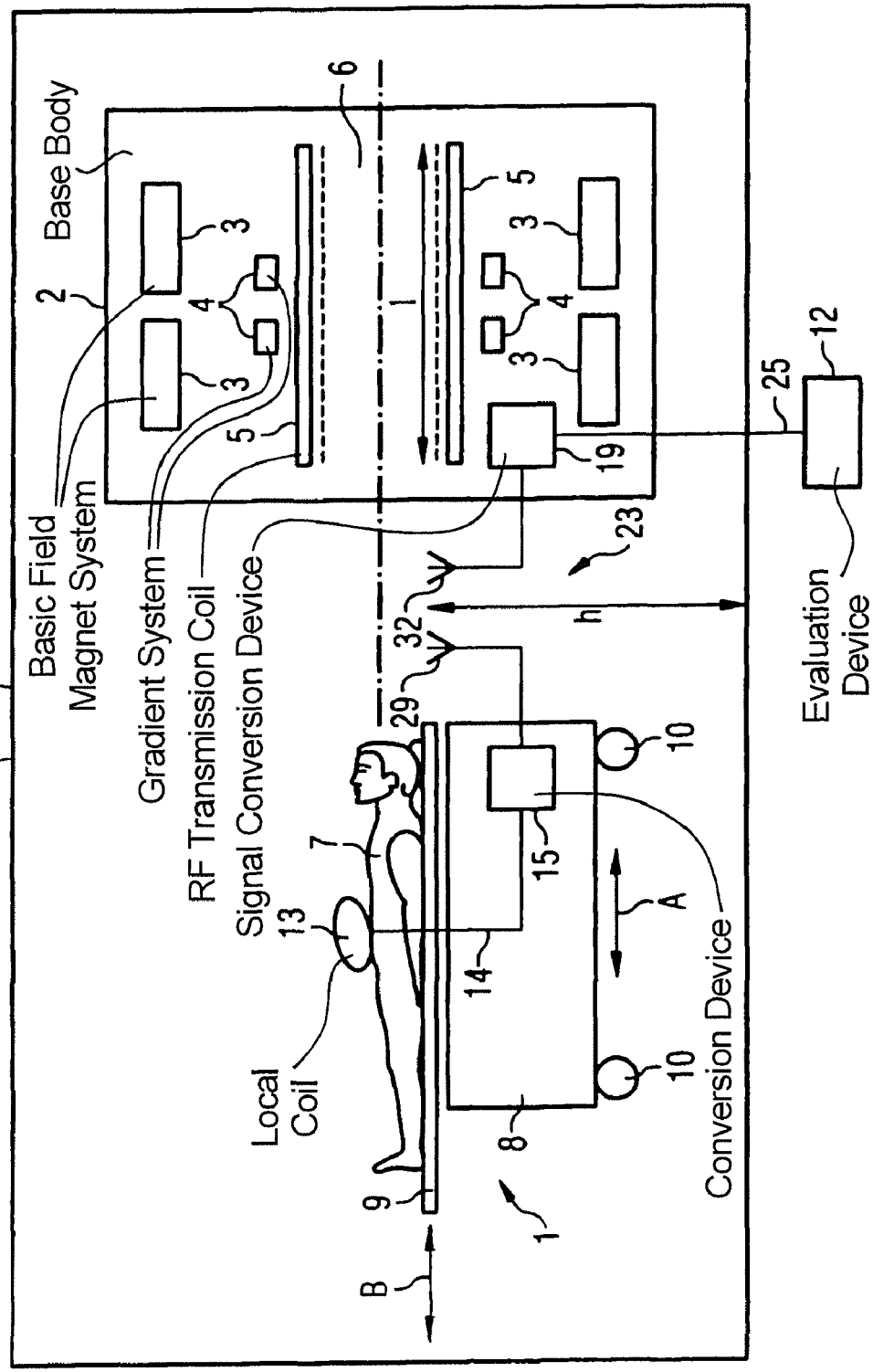

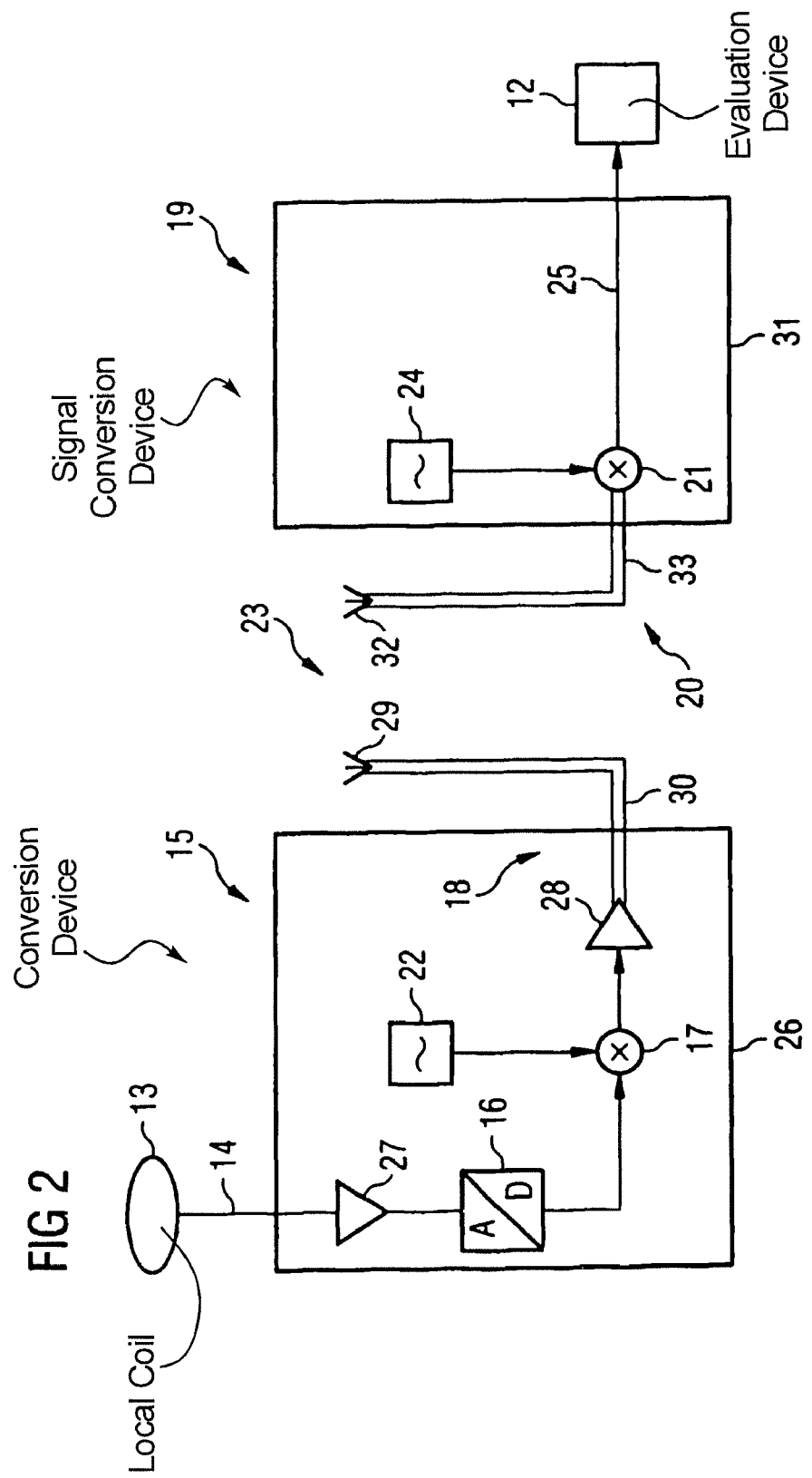

MAGNETIC RESONANCE SYSTEM WITH TRANSMISSION OF A DIGITIZED MAGNETIC RESONANCE SIGNAL ACROSS AN AIR GAP

BACKGROUND OF THE INVENTION

1. Field of the Invention

The present invention concerns a magnetic resonance system.

2. Description of the Prior Art

Magnetic resonance systems typically has a patient receptacle in a data acquisition unit (scanner) interacting with the patient in the receptacle. The scanner has at least one basic field magnet system, a gradient system and an RF transmission coil. A static basic magnetic field is generated by the basic field magnet system in a patient tunnel that is stationary relative to the scanner housing. Gradient fields are generated in the patient tunnel by the gradient system. RF excitation fields are generated in the patient tunnel by the RF transmission coil. This results in nuclei of the patient in the patient tunnel being excited to magnetic resonance. The patient receptacle has a subframe and a patient bed supported by the subframe. The patient bed bears the patient and is mobile relative to the subframe so that the patient (when he or she lies on the patient bed) can be conveyed through the patient tunnel relative to the subframe. The unit composed of the scanner and patient receptacle is normally arranged in an RF-sealed shielded compartment.

In principle it is possible to also use the RF coil to receive magnetic resonance signals excited by the RF coil operated in a transmission mode. This manner of operation, however, provides only qualitatively low-grade magnetic resonance signals. Therefore the magnetic resonance signals are normally acquired by means of local coils that are attached to the patient or to the patient bed, near the patient.

It is possible to connect the local coils via cables with an evaluation device for the magnetic resonance signals, but this requires the use of multiple cables. Furthermore, each cable must have a plug connection in order to be able to separate the local coils from the evaluation device.

It is known to convert magnetic resonance signals from local coils in analog form to a different frequency and to transfer them via an air gap to the evaluation device. This type of transmission, however, is limited to analog signals for reasons of the available bandwidth. Furthermore, only the magnetic resonance signals of a single local coil can be transferred to the evaluation device by means of this type of signal transmission.

In the future it is planned to digitize the magnetic resonance signals of the local coils as early as possible and to transmit them on in digital form. In principle it is possible to conduct this data transmission via cables. However, due to the required bandwidth of the digitized magnetic resonance signals the fear exists that a use of plug connections will not function reliably in practice.

SUMMARY OF THE INVENTION

An object of the present invention is to provide a reliable and comfortable mode of signal transmission of magnetic resonance signals in digitized form from the local coils to the evaluation device.

According to the invention, the patient receptacle has a subframe and a patient bed supported by the subframe. The subframe can be moved relative to the housing of the magnetic resonance scanner so that the patient receptacle can be positioned on the scanner. The patient bed bears the patient and is movable relative to the subframe. If the patient lies on the patient bed and the patient receptacle is positioned on the scanner, the patient can be conveyed through the patient tunnel of the scanner relative to the subframe by movement of the patient bed. The patient receptacle has a signal conversion device at the side of the receptacle, which signal conversion device having at least one A/D converter, one modulator and a transmitter. The A/D converter receives a magnetic resonance signal acquired by the local coil and digitizes it. The modulator modulates a carrier signal with the digitized magnetic resonance signal. The transmitter transmits the modulated carrier signal via an air gap to a signal conversion device at the scanner housing.

In a preferred embodiment of the patient receptacle, the transmitter has a transmission amplifier and a transmission antenna, wherein the transmission amplifier is connected with the transmission antenna via a band-limited gigahertz transmission link. With this embodiment it is in particular possible to conduct a band-limiting of the signal transmitted to the transmission antenna. In particular, frequencies in the range of the Larmor frequency of the magnetic resonance system can be filtered out. The gigahertz transmission link can be fashioned as needed. For example, it can be fashioned as a component known as a cutoff wave guide. The transmission antenna can likewise be fashioned as needed. For example, it can be fashioned as a horn radiator.

In an additional preferred embodiment of the present invention, a preamplifier is arranged before the A/D converter. A higher reception sensitivity can be realized via this embodiment.

At least the A/D converter and the modulator are advantageously surrounded by an RF-sealed shielding. A better immunity to interference of the signal conversion device at the receptacle results with this embodiment.

In an additional preferred embodiment of the present invention, the A/D converter and the modulator are arranged in the subframe. These can be arranged at a location at which the problem of limited available space does not exist or is only minimally present.

According to the invention, the base body of the scanner has at least one basic field magnet system, a gradient system and an RF transmission coil. A static basic magnetic field is generated in the patient tunnel that is stationary relative to the base body by the basic magnet system. Gradient fields are generated in the patient tunnel by the gradient magnet system. RF excitation fields are generated in the patient tunnel by the RF transmission coil. Nuclei in a patient in the patient tunnel thus are excited to magnetic resonance. The base body has a signal conversion device that includes at least one receiver and a demodulator. The receiver receives a carrier signal transmitted via an air gap from a conversion device at the receptacle to the signal conversion device at the base body, this carrier signal being modulated with a digitized magnetic resonance signal. The signal conversion device at the receptacle is a component of said patient receptacle, which comprises a subframe and a patient bed borne by the subframe. The demodulator extracts the digitized magnetic resonance signal from the received, modulated carrier signal via demodulation and supplies it to an evaluation device for continuing evaluation.

In a preferred embodiment of the base body (scanner), the receiver has a reception antenna which is connected with the demodulator via a band-limited gigahertz transmission link. Frequencies in the range of the Larmor frequency of the magnetic resonance system can thus be filtered out, analogous to the signal conversion device at the receptacle. The gigahertz transmission link can be fashioned as needed analogous to the signal conversion device at the receptacle, for example as a cutoff wave guide. The reception antenna can also be fashioned as needed in an analogous manner, for example as a horn radiator.

The demodulator is advantageously surrounded by an RF-sealed shielding. An operation immune to interference results via this procedure.

In an additional preferred embodiment, the base body comprises at least one positioning aid by means of which the patient receptacle can be positioned at a predetermined position relative to the base body. A proper alignment of the transmission antenna of the signal conversion device at the receptacle and the reception antenna of the signal conversion device at the base body relative to one another is thereby facilitated. If necessary the subframe can also have at least one positioning aid which facilitates the positioning of the patient receptacle relative to the base body.

The base body (scanner) is normally surrounded by an RF-sealed shielding compartment. The RF-sealed shielding compartment is dimensioned such that it is in the position to also accommodate the patient receptacle. The evaluation device can alternatively be arranged inside or—preferably—outside of the RF-sealed shielding compartment.

The transmission of the demodulated, digitized magnetic resonance signal to the evaluation device can ensue as necessary. In particular, it is possible for the demodulator to supply the demodulated, digital magnetic resonance signal to the evaluation device via an optical wave guide, for example a fiber optic cable. The object is further achieved via a magnetic resonance system that possesses a patient receptacle according to the invention and a base body according to the invention that interacts with the patient receptacle.

In the embodiment according to the invention the air gap can be very small. The air gap is in particular advantageously smaller than one meter, and can even be smaller than 10 cm.

BRIEF DESCRIPTION OF THE DRAWINGS

FIG. 1 schematically illustrates a magnetic resonance system constructed and operating in accordance with the present invention.

FIG. 2 illustrates the basics of signal transmission according to the invention.

DESCRIPTION OF THE PREFERRED EMBODIMENTS

As shown in FIG. 1, a magnetic resonance system has a patient receptacle 1 and a base body 2. The patient receptacle 1 and the base body 2 interact.

The base body 2 has at least one basic field magnet system 3, one gradient system 4 and an RF transmission coil 5. A static basic magnetic field is generated by the basic field magnet system 3 in a patient tunnel 6 that is stationary relative to the base body 2. The static basic magnetic field can be 1.5 T or 3 T, for example. Other values are also possible depending on the design of the basic field magnet system 3. Gradient fields are generated in the patient tunnel 6 by means of the gradient system 4. The gradient system 4 can be designed as is generally known. RF excitation fields are generated in the patient tunnel 6 by the RF transmission coil 5. The RF transmission coil 5, for example, can be fashioned as a birdcage resonator or as an array antenna.

The patient tunnel 6 exhibits a length l that is normally between 40 and 60 cm. If a patient 7 is arranged in the patient tunnel 6, nuclei in the patient 7 can be excited to magnetic resonance by the corresponding operation of the basic field magnet system 3, the gradient system 4 and the RF transmission coil 5.

The patient receptacle 1 has a subframe 8 and a patient bed 9. The patient bed 9 is supported by the subframe 8. The subframe 8 is movable relative to the base body 2. The patient receptacle 1 can be positioned on the base body 2. This is indicated by a double arrow A in FIG. 1. The mobility of the subframe 8 can be achieved via rollers 10, for example. The rollers 10 (insofar as they are present) can additionally be movable via rotation on a vertical axis and be capable of being arrested. Such embodiments are generally typical in movable hospital beds, for example.

The patient bed 9 bears the patient 7. The patient bed 9 is movable relative to the subframe 8. This is indicated by a double arrow B in FIG. 1.

If the patient 7 lies on the patient bed 9 and the patient receptacle 1 is positioned on the base body 2, the patient 7 can be conveyed through the patient tunnel 6 via corresponding movement of the patient bed 9 relative to the subframe 8. Due to the positioning of the patient receptacle 1 on the base body 2, a distance of the subframe 8 from the base body 2 is normally only a few centimeters. Furthermore, the subframe 8 has a defined height position h relative to the base body 2. Due to the fact that the patient bed 9 must be movable through the patient tunnel 6, a lateral offset of the subframe 8 relative to the base body 2 is furthermore relatively precisely defined.

The base body 2 is normally surrounded by an RF-sealed shielding compartment 11. The shielding compartment 11 effects an RF shielding. The shielding compartment 11 is dimensioned such that it is also in the position to accommodate the patient receptacle 1.

Acquired magnetic resonance signals are evaluated by means of an evaluation device 12. The evaluation device 12 can be arranged inside the shielding compartment 11. However, it is normally arranged outside the shielding compartment 11, corresponding to the depiction from FIG. 1.

Multiple local coils 13 are normally arranged on the patient 7. For reasons of clarity, only a single local coil 13 is shown in the FIG. The local coil 13 is connected via a cable 14 with a signal conversion device 15 at the receptacle. The cable 14 can be fashioned as a coaxial cable, for example. The signal conversion device 15 is a component of the patient receptacle 1.

According to FIG. 2, the signal conversion device 15 at the receptacle has an A/D converter 16, a modulator 17 and a transmitter 18. The A/D converter 16 and the modulator 17 are advantageously arranged in a subframe 8.

The signal conversion device 15 at the receptacle interacts with a signal conversion device 19 at the base body 2. As the name says, the signal conversion device 19 at the base body 2 is a component of the base body 2. According to FIG. 2, the signal conversion device 19 at the base body has at least one receiver 20 and a demodulator 21.

The technologies that are required to produce the signal conversion device 15 at the receptacle and the signal conversion device 19 at the base body are known. In particular, the A/D converter 16 can also be designed as is typical in A/D converters of the prior art in magnetic resonance systems. The modulator 17 and the transmitter 18 or, respectively, the receiver 20 and the demodulator 21 are commercially available. Purely as an example, reference can be made to Giga Link 6232/6432/6442 from the company Proxim Wireless, San Jose, Calif. 95131 USA.

The local coil 13, the signal conversion device 15 at the receptacle, the signal conversion device 19 at the base body and the evaluation device 12 interact as follows:

The local coil 13 receives an analog magnetic resonance signal of the patient 7. The received magnetic resonance signal is transmitted via the cable 14 to the signal conversion device 15 at the receptacle. The A/D converter 16 of the signal conversion device 15 at the receptacle receives the analog magnetic resonance signal and digitizes it. The output signal of the ND converter 16 (thus the digitized magnetic resonance signal) is supplied as serial bits to the modulator 17. The modulator 17 modulates a carrier signal with the digitized magnetic resonance signal. For example, the carrier signal can be delivered from an oscillator 22 that is a component of the modulator 17. The modulated carrier signal is supplied to the transmitter 18. The transmitter 18 transmits the modulated carrier signal via an air gap 23 to the signal conversion device 19 at the base body 2.

The receiver 20 receives the modulated carrier signal transmitted via the air gap 23. The receiver 20 relays the modulated carrier signal that it has received to the demodulator 21. The demodulator 21 extracts the digitized magnetic resonance signal from the received modulated carrier signal via demodulation. For this purpose, the demodulator can include an oscillator 24. The digitized magnetic resonance signal is supplied to the evaluation device 12 for continuing evaluation. The supply to the evaluation device 12 ensues via a cable 25. The cable 25 can be an electrical cable, in particular a coaxial cable. However, the cable 25 is advantageously an optical wave guide, in particular an optical fiber.

The A/D converter 16 and the modulator 17 are normally surrounded by an RF-sealed shielding 26. If necessary, additional electronic components can be arranged within the RF-sealed shielding 26. For example, if a preamplifier 27 is arranged before the A/D converter 16, the preamplifier 27 is advantageously likewise arranged inside the RF-sealed shielding 26.

Furthermore, the transmitter 18 normally possesses a transmission amplifier 28 and a transmission antenna 29. The transmission amplifier 28 in this case is likewise advantageously arranged inside the RF-sealed shielding 26. In contrast to this, the transmission antenna 29 is arranged outside of the RF-sealed shielding 26. The transmission amplifier 28 is connected with the transmission antenna 29 via a band-limited gigahertz transmission link 30. The gigahertz transmission link 30 can be fashioned as a cutoff wave guide, for example. The transmission antenna 29 can be fashioned as a horn radiator, for example.

In a manner analogous to the embodiment on the part of the receptacle, the demodulator 21 is normally surrounded by an RF-sealed shielding 31. Insofar as it is required, additional electronic components can be arranged within the RF-sealed shielding 31.

The receiver 20 normally has a reception antenna 32. The reception antenna 32 is arranged outside of the RF-sealed shielding 21. The reception antenna 32 is connected with the demodulator 21 via a band-limited gigahertz transmission link 33. The gigahertz transmission link 33 can be fashioned as a cutoff wave guide, the reception antenna 32 as a horn radiator.

As mentioned, due to the embodiment according to the invention the height position h of the transmission antenna 29 is defined. It is therefore possible without further measures to arrange the reception antenna 32 at the same height position h. Due to the fact that, in the event that the subframe 8 is positioned on the base body 2, the patient bed 9 can be inserted into the patient tunnel 6, the subframe 8 must furthermore exhibit a defined lateral positioning relative to the base body 1.

Therefore, without further measures it is possible to arrange the transmission antenna 29 and the reception antenna 32 such that they are situated (completely or nearly) opposite one another. It is therefore possible without further measures for the air gap 23 to be smaller than one meter. It can even be smaller than 10 cm.

In order to facilitate a precise positioning of the patient receptacle 1 relative to the base body 2, the base body 2 can have at least one corresponding positioning aid. Due to the positioning aid (or the positioning aids), it can be ensured that the patient receptacle 1 is positioned at a predetermined position relative to the base body 2. The positioning at the predetermined position hereby naturally applies for the situation that the patient receptacle 1 is positioned at the base body 2.

In the simplest case, the positioning aid is in the form of markings on the base body 2 that enable an operator to produce the corresponding positioning of the patient receptacle 1. For example, the positioning aid can be fashioned as a scale. It is likewise possible that the base body 2 and the subframe 8 possess corresponding positioning elements that interact with one another and ensure a positioning of the patient receptacle 1 relative to the base body 2 that is precise to the millimeter.

The present invention possesses many advantages. In particular, a transmission of the magnetic resonance signals from the local coil 13 to the evaluation examination volume 12 is possible in a simple and reliable manner. Known techniques can be used for this. A necessity of a transmission of the digitized magnetic resonance signal via a plug connection is avoided. Requirements for the precision of the positioning of the patient receptacle 1 relative to the base body 2 are relatively low. Due to the fact that a transmission ensues in the gigahertz range, a negative effect on the MR signal quality is safely avoided.

Although modifications and changes may be suggested by those skilled in the art, it is the intention of the inventors to embody within the patent warranted hereon all changes and modifications as reasonably and properly come within the scope of their contribution to the art.

We claim as our invention:

1. A patient receptacle for a magnetic resonance system, said magnetic resonance system having a base body comprising a patient tunnel, and a base body signal conversion device, said patient receptacle comprising:

a subframe;

a patient bed supported by and movable on said subframe, said patient bed being adapted to receive a patient thereon, said subframe being positioned relative to said base body to convey on the patient bed through the patient tunnel by movement of the patient bed on the subframe;

said patient bed and said subframe forming a patient receptacle structure;

said patient receptacle structure comprising a local coil that acquires an analog magnetic resonance signal;

a patient receptacle signal conversion device located at said patient receptacle structure, said patient receptacle signal conversion device comprising an analog-to-digital converter, a modulator, and a transmitter;

said analog-to-digital converter being configured to receive the analog magnetic resonance signal acquired by the local coil and to convert the analog magnetic resonance signal into a digital magnetic resonance signal;

said modulator being configured to modulate a carrier signal with said digital magnetic resonance signal, to produce a modulated carrier signal; and said transmitter being configured to transmit the modulated carrier signal via an air gap to said base body signal conversion device.

2. A patient receptacle as claimed in claim 1 wherein said transmitter comprises a transmission amplifier and a transmission antenna, and a band-limited gigahertz transmission link connecting an output of said transmission amplifier with said transmission antenna.

3. A patient receptacle as claimed in claim 1 comprising a pre-amplifier connected preceding said analog-to-digital converter.

4. A patient receptacle as claimed in claim 1 comprising RF shielding surrounding at least said analog-to-digital converter and said modulator.

5. A patient receptacle as claimed in claim 1 wherein said analog-to-digital converter and said modulator are located in said subframe.

6. A base body for a magnetic resonance system, said magnetic resonance system having a patient receptacle comprising a movable patient bed and a patient receptacle signal conversion device that emits a carrier signal modulated with a digitized magnetic resonance signal, said base body comprising:
- a base body housing having a patient tunnel therein adapted to receive a patient on the patient bed of the patient receptacle;
- a basic field magnet system configured to generate a static basic magnetic field in said patient tunnel;
- a gradient system configured to generate gradient fields in said patient tunnel;
- an RF system configured to radiate an RF excitation field in said tunnel that excites nuclei in the patient on the patient bed in the tunnel to magnetic resonance, so as to emit an analog magnetic resonance signal;
- a signal conversion device in said housing, said signal conversion device comprising a receiver and a demodulator;
- said receiver being configured to receive said carrier signal from said patient receptacle signal conversion device via an air gap, said digitized magnetic resonance signal with which said carrier signal is modulated corresponding to said analog magnetic resonance signal; and
- said demodulator being configured to extract said digitized magnetic resonance signal from the received carrier signal and to supply the demodulated signal to an evaluation device for evaluation thereof.

7. A base body as claimed in claim 6 wherein said receiver comprises a reception antenna and a band-limited gigahertz transmission link connecting said reception antenna with an input of said demodulator.

8. A base body as claimed in claim 6 comprising RF shielding surrounding said demodulator.

9. A base body as claimed in claim 6 comprising a positioning aid configured to assist positioning of said patient receptacle at a predetermined position relative to said housing.

10. A base body as claimed in claim 6 comprising an RF shielded compartment in which said housing is contained, said RF shielded compartment having a size that also accommodates said patient receptacle.

11. A base body as claimed in claim 10 wherein said evaluation device is located outside of said RF shielded compartment.

12. A base body as claimed in claim 6 comprising an optical waveguide connected between said demodulator and said evaluation device, said demodulator supplying said demodulated digital magnetic resonance signal to the evaluation device via said optical waveguide.

13. A magnetic resonance system comprising:
- a base body comprising a base body housing having a patient tunnel therein adapted to receive a patient on the patient bed of the patient receptacle;
- a subframe;
- a patient bed supported by and movable on said subframe, said patient bed being adapted to receive a patient thereon, said subframe being positioned relative to said base body to convey on the patient bed through the patient tunnel by movement of the patient bed on the subframe;
- said base body comprising a basic field magnet system configured to generate a static basic magnetic field in said patient tunnel;
- said base body comprising a gradient system configured to generate gradient fields in said patient tunnel;
- said patient bed and said subframe forming a patient receptacle structure;
- said patient receptacle structure comprising a local coil that acquires an analog magnetic resonance signal;
- a patient receptacle signal conversion device located at said patient receptacle structure, said patient receptacle signal conversion device comprising an analog-to-digital converter, a modulator, and a transmitter;
- said analog-to-digital converter being configured to receive the analog magnetic resonance signal acquired by the RF local coil and to convert the analog magnetic resonance signal into a digital magnetic resonance signal;
- said modulator being configured to modulate a carrier signal with said digital magnetic resonance signal, to produce a modulated carrier signal;
- said transmitter being configured to transmit the modulated carrier signal via an air gap to said base body signal conversion device;
- said base body comprising a signal conversion device in said housing, said signal conversion device comprising a receiver and a demodulator;
- said receiver being configured to receive said carrier signal from said patient receptacle signal conversion device via an air gap, said digitized magnetic resonance signal with which said carrier signal is modulated corresponding to said analog magnetic resonance signal; and
- said demodulator being configured to extract said digitized magnetic resonance signal from the received carrier signal and to supply the demodulated signal to an evaluation device for evaluation thereof.

14. A magnetic resonance system as claimed in claim 13, wherein said air gap is less than one meter.

15. A magnetic resonance system as claimed in claim 13 wherein said air gap is less than 10 cm.

* * * * *